US012720825B2

(12) United States Patent
Chang et al.

(10) Patent No.: US 12,720,825 B2
(45) Date of Patent: Aug. 25, 2026

(54) ELECTROSTATIC DISCHARGE (ESD) PROTECTION DEVICE AND TRANSISTOR STRUCTURE

(71) Applicant: Vanguard International Semiconductor Corporation, Hsinchu (TW)

(72) Inventors: Ting-Yu Chang, Zhubei City (TW); Yeh-Ning Jou, Hsinchu City (TW); Jian-Hsing Lee, Hsinchu City (TW); Chieh-Yao Chuang, Kaohsiung City (TW); Hsien-Feng Liao, Taichung City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 451 days.

(21) Appl. No.: 18/468,435

(22) Filed: Sep. 15, 2023

(65) Prior Publication Data

US 2025/0098244 A1 Mar. 20, 2025

(51) Int. Cl.
*H10D 62/10* (2025.01)
*H10D 30/60* (2025.01)
(Continued)

(52) U.S. Cl.
CPC .......... *H10D 62/151* (2025.01); *H10D 30/60* (2025.01); *H10D 62/106* (2025.01);
(Continued)

(58) Field of Classification Search
CPC .......... H10D 89/811–815; H10D 89/601–931; H10D 62/105–112
See application file for complete search history.

(56) References Cited

U.S. PATENT DOCUMENTS 9,478,608 B2 * 10/2016 Salcedo ............... H10D 62/114
9,608,109 B1 * 3/2017 Tsai .................... H10W 10/012
(Continued)

FOREIGN PATENT DOCUMENTS

JP 2000012854 A * 1/2000 ......... H01L 29/0634

OTHER PUBLICATIONS

M. Eizenberg, Chapter 1—Introduction, Interlayer Dielectrics for Semiconductor Technologies, 2003, Academic Press, p. 1-6 (Year: 2003).*

(Continued)

*Primary Examiner* — Younes Boulghassoul
(74) *Attorney, Agent, or Firm* — Birch, Stewart, Kolasch & Birch, LLP

(57) ABSTRACT

An electrostatic discharge (ESD) protection device is provided. A deep-well region is formed on a substrate. A first well region, a second well region, a third well region, and a fourth well region are formed on the deep-well region. A fifth well region is formed in the fourth well region. A first doped region is formed in the first well region. A second doped region is formed in the second well region. A third doped region is formed in the fourth well region. A gate structure covers the third well region. Each of the substrate, the second well region, the fourth well region, the second doped region, and the third doped region has a first conductivity type. Each of the deep-well region, the first well region, the third well region, the fifth well region, and the first doped region has a second conductivity type.

18 Claims, 8 Drawing Sheets

(51) Int. Cl.

| | |
|---|---|
| ***H10D 62/13*** | (2025.01) |
| ***H10D 89/60*** | (2025.01) |
| *H10D 62/17* | (2025.01) |

(52) U.S. Cl.

CPC ......... *H10D 62/116* (2025.01); *H10D 89/811* (2025.01); *H10D 62/307* (2025.01)

(56) References Cited

U.S. PATENT DOCUMENTS

| | | | | |
|---|---|---|---|---|
| 9,691,752 | B1* | 6/2017 | Chao | H10D 62/116 |
| 9,831,233 | B2* | 11/2017 | Salcedo | H10D 89/713 |
| 9,972,615 | B1* | 5/2018 | Wang | H10D 30/603 |
| 10,249,609 | B2* | 4/2019 | Salcedo | H10D 89/713 |
| 2013/0049112 | A1* | 2/2013 | Lai | H10D 62/151<br>257/E29.256 |
| 2013/0187218 | A1* | 7/2013 | Lai | H10D 62/151<br>257/E29.256 |
| 2013/0277745 | A1* | 10/2013 | Tsai | H10D 89/711<br>257/355 |
| 2014/0339601 | A1* | 11/2014 | Salcedo | H10D 89/713<br>257/140 |
| 2016/0247804 | A1* | 8/2016 | Harada | H10D 84/856 |
| 2017/0271321 | A1* | 9/2017 | Yoshino | H10D 62/151 |
| 2017/0309613 | A1* | 10/2017 | Chao | H10D 89/813 |
| 2018/0114787 | A1* | 4/2018 | Lin | H10D 89/713 |
| 2018/0211951 | A1* | 7/2018 | Luo | H10D 89/811 |
| 2022/0059525 | A1* | 2/2022 | Mahajan | H10D 30/603 |
| 2023/0253481 | A1* | 8/2023 | Chang | H10D 30/0281<br>257/339 |
| 2023/0326919 | A1* | 10/2023 | Chiu | H10D 89/711<br>257/303 |
| 2023/0387103 | A1* | 11/2023 | Liao | H10D 89/814 |
| 2024/0153943 | A1* | 5/2024 | Hsu | H10D 89/601 |
| 2025/0072042 | A1* | 2/2025 | Chen | H10D 62/126 |

OTHER PUBLICATIONS

C. Leung and E. Ong, Chapter 5—Silicon-based dielectrics, Interlayer Dielectrics for Semiconductor Technologies, 2003, Academic Press, p. 121-156 (Year: 2003).*

JP-2000012854_A_H (Machine Translation) (Year: 2000).*

* cited by examiner

ELECTROSTATIC DISCHARGE (ESD) PROTECTION DEVICE AND TRANSISTOR STRUCTURE

BACKGROUND OF THE INVENTION

Field of the Invention

The present invention relates to an electrostatic discharge (ESD) protection device, and, in particular, to an ESD protection device that can be used as a transistor.

Description of the Related Art

As the semiconductor manufacturing process has developed, electrostatic discharge (ESD) protection has become one of the most critical reliability issues in integrated circuits (IC). In particular, as semiconductor processing advances into the deep sub-micron stage, scaled-down devices and thinner gate oxides are more vulnerable to ESD stress.

Generally, the input/output pads on IC chips must sustain 2 k Volts of ESD stress in high Human Body Mode (HBM) or 200 Volts in Machine Mode. Thus, the input/output pads on IC chips are usually designed to include ESD protection devices or circuits for protecting the core circuit in the IC chip from ESD damage.

BRIEF SUMMARY OF THE INVENTION

In accordance with an embodiment of the disclosure, an electrostatic discharge (ESD) protection device comprises a substrate, a deep-well region, a first well region, a second well region, a third well region, a fourth well region, a fifth well region, a first doped region, a second doped region, a third doped region, and a gate structure. The substrate has a first conductivity type. The deep-well region is formed on the substrate and has a second conductivity type. The first well region is formed on the deep-well region and has the second conductivity type. The second well region is formed on the deep-well region and has the first conductivity type. The third well region is formed on the deep-well region and has the second conductivity type. The fourth well region is formed on the deep-well region and has the first conductivity type. The fifth well region is formed in the fourth well region and has the second conductivity type. The first doped region is formed in the first well region and has the second conductivity type. The second doped region is formed in the second well region and has the first conductivity type. The third doped region is formed in the fourth well region and has the first conductivity type. The gate structure covers the third well region.

In accordance with another embodiment of the disclosure, a transistor structure comprises a bulk doped region, a source doped region, a gate structure, a first drain doped region, a fifth well region, and a sixth well region. The bulk doped region is formed in a first well region. The source doped region is formed in a second well region. The gate structure covers a third well region. The first drain doped region is formed in a fourth well region. The fifth well region is formed in the fourth well region. The sixth well region is formed in the fourth well region. The bulk doped region, the first well region, the third well region, the fifth well region, and the sixth well region have the same conductivity type. The source doped region, the second well region, the first drain doped region, and the fourth well region have the same conductivity type.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
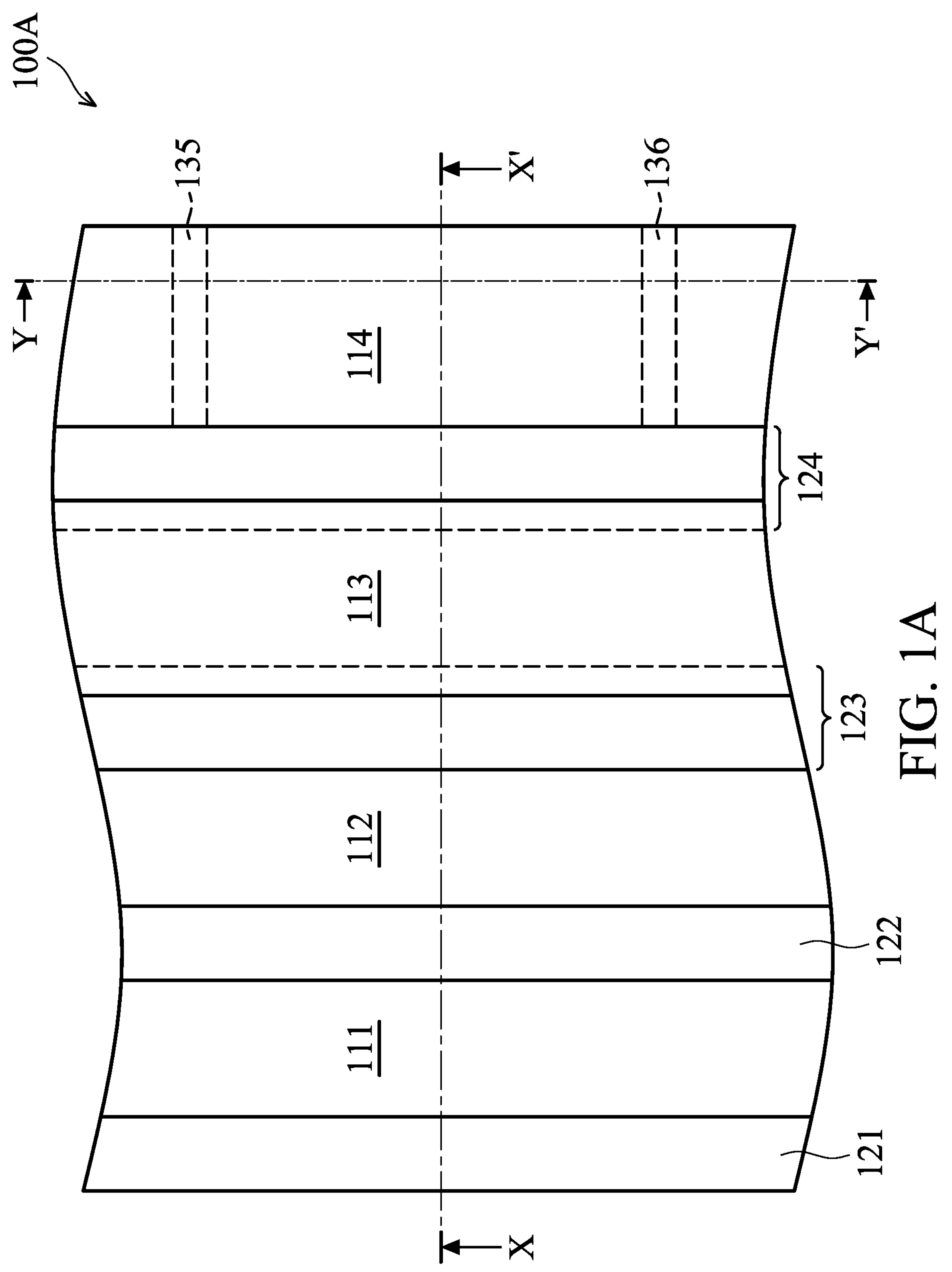
FIG. 1A is a plan view of an exemplary embodiment of an ESD protection device according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a plan view of an exemplary embodiment of an electrostatic discharge (ESD) protection device according to various aspects of the present disclosure. In this embodiment, the ESD protection device 100A comprises doped regions 111, 112, and 114, a gate structure 113, and well regions 135 and 136. The doped region 111 is disposed between the isolation structures 121 and 122. The isolation structure 122 insulates the doped region 111 from the doped region 112. The isolation structure 123 insulates the doped region 112 from the gate structure 113. The gate structure 113 is disposed on the isolation structures 123 and 124 and covers the isolation structures 123 and 124. The isolation structure 124 insulates the gate structure 113 from the doped region 114.

Figure 1B:
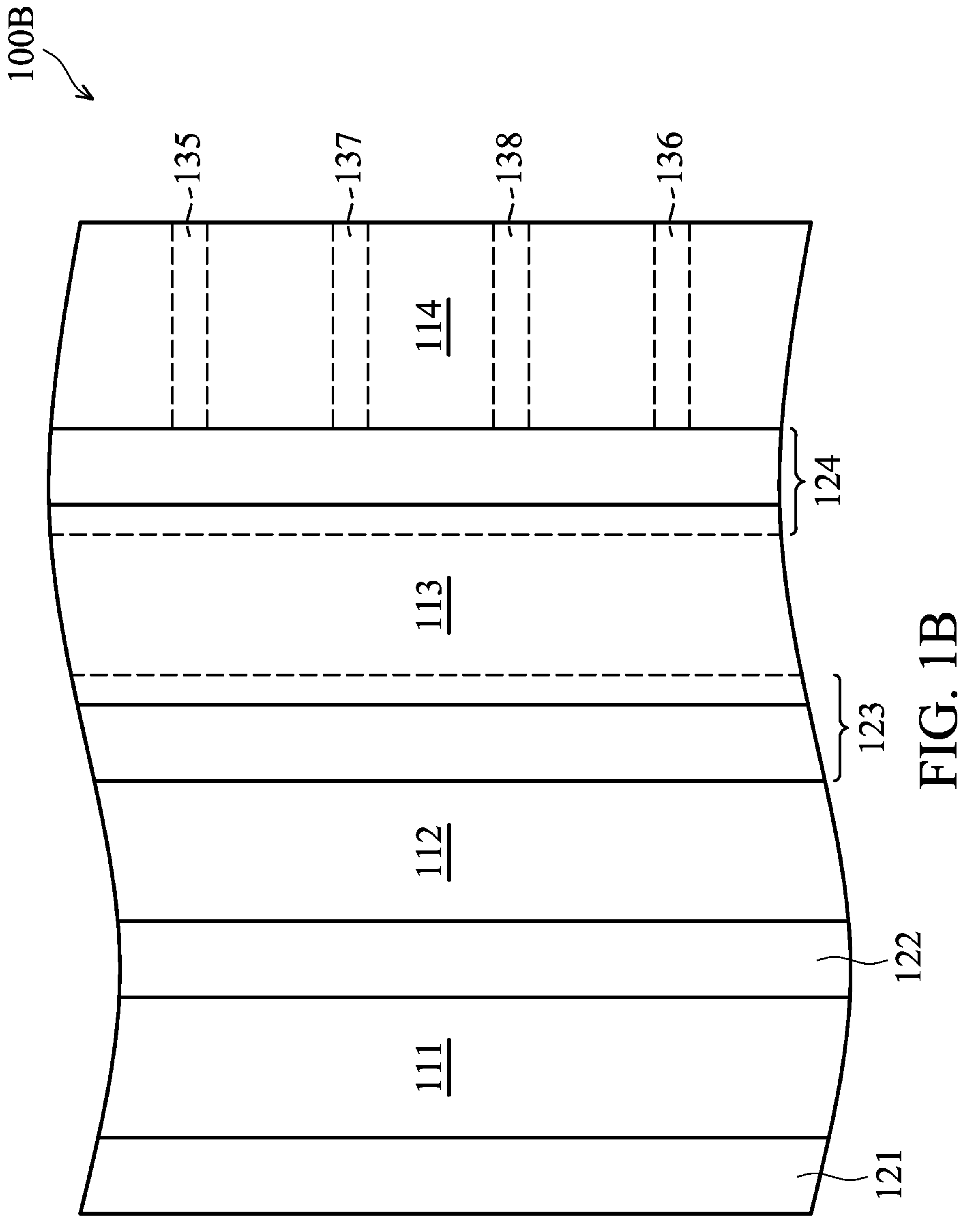
FIG. 1B is a plan view of another exemplary embodiment of an ESD protection device according to various aspects of the present disclosure.

The doped region 114 covers the well regions 135 and 136. The number of well regions covered by the doped region 114 is not limited in the present disclosure. In FIG. 1B, the doped region 114 covers the well regions 135~138. In other embodiments, the doped region 114 covers more well regions. The sizes of the well regions 135 and 136 are not limited in the present disclosure. In one embodiment, the size of the well region 135 is the same as the size of the well region 136.

The structures of the well regions 135 and 136 are not limited in the present disclosure. In this embodiment, the well regions 135 and 136 are disposed under the doped region 114 and contact the doped region 114. In one embodiment, the well regions 135 and 136 are exposed from the surface of the doped region 114. In another embodiment, the well region 135 is disposed under a first isolation structure, and the well region 136 is disposed under a second isolation structure. In this case, the first and second isolation structures are exposed from the top-surface of the doped region 114.

Figure 1C:
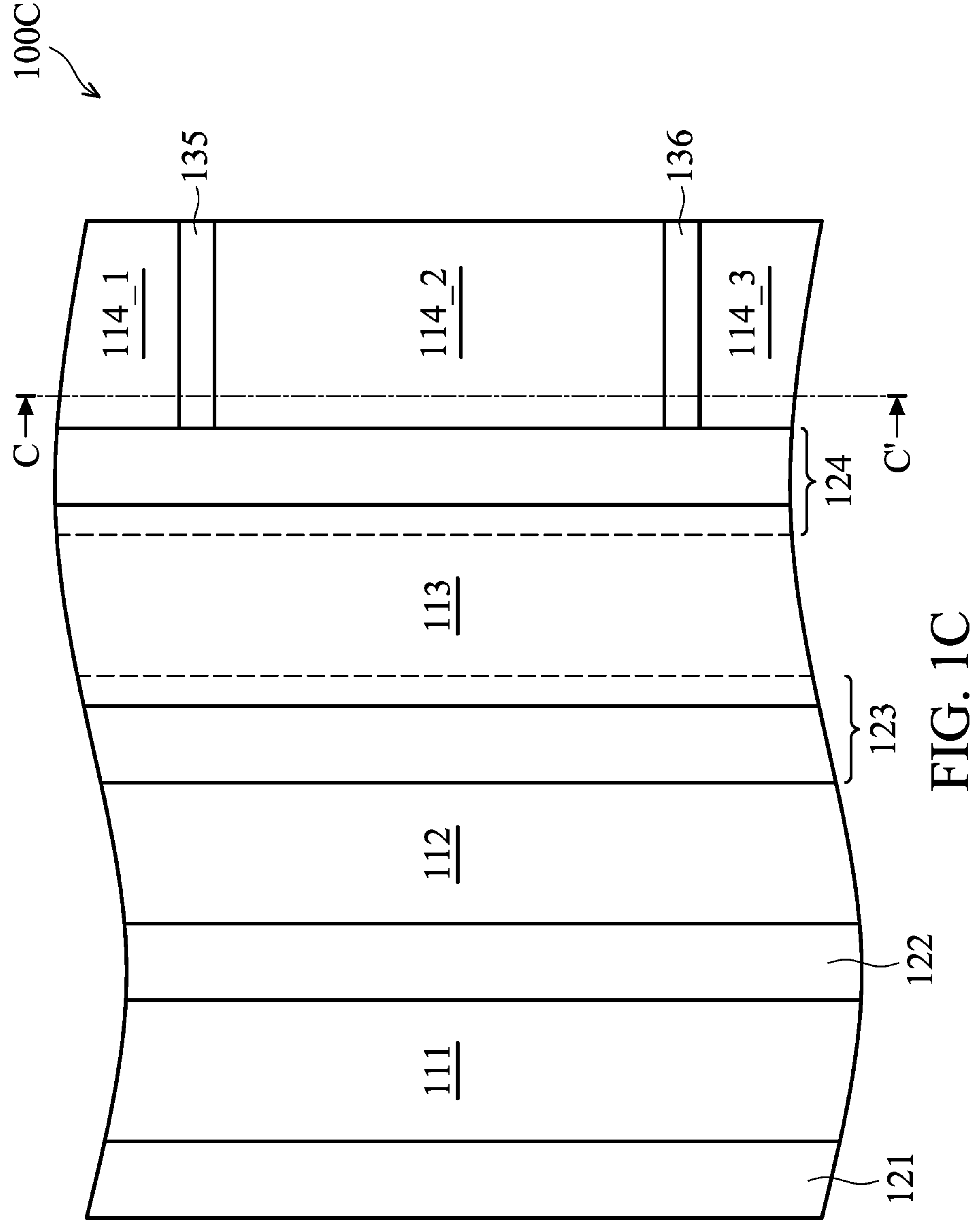
FIG. 1C is a plan view of another exemplary embodiment of an ESD protection device according to various aspects of the present disclosure.

FIG. 1C is a plan view of another exemplary embodiment of an ESD protection device according to various aspects of the present disclosure. FIG. 1C is similar to FIG. 1A with the exception that the well regions 135 and 136 are exposed from the surface of the doped region 114 and the doped region 114 is divided into the doped regions 114_1~114_3. In this embodiment, the well region 135 insulates the doped region 114_1 from the doped region 114_2. The well region 136 insulates the doped region 114_2 from the doped region 114_3. In some embodiments, the doped regions 114_1~114_3 are electrically connected to each other.

Figure 1D:
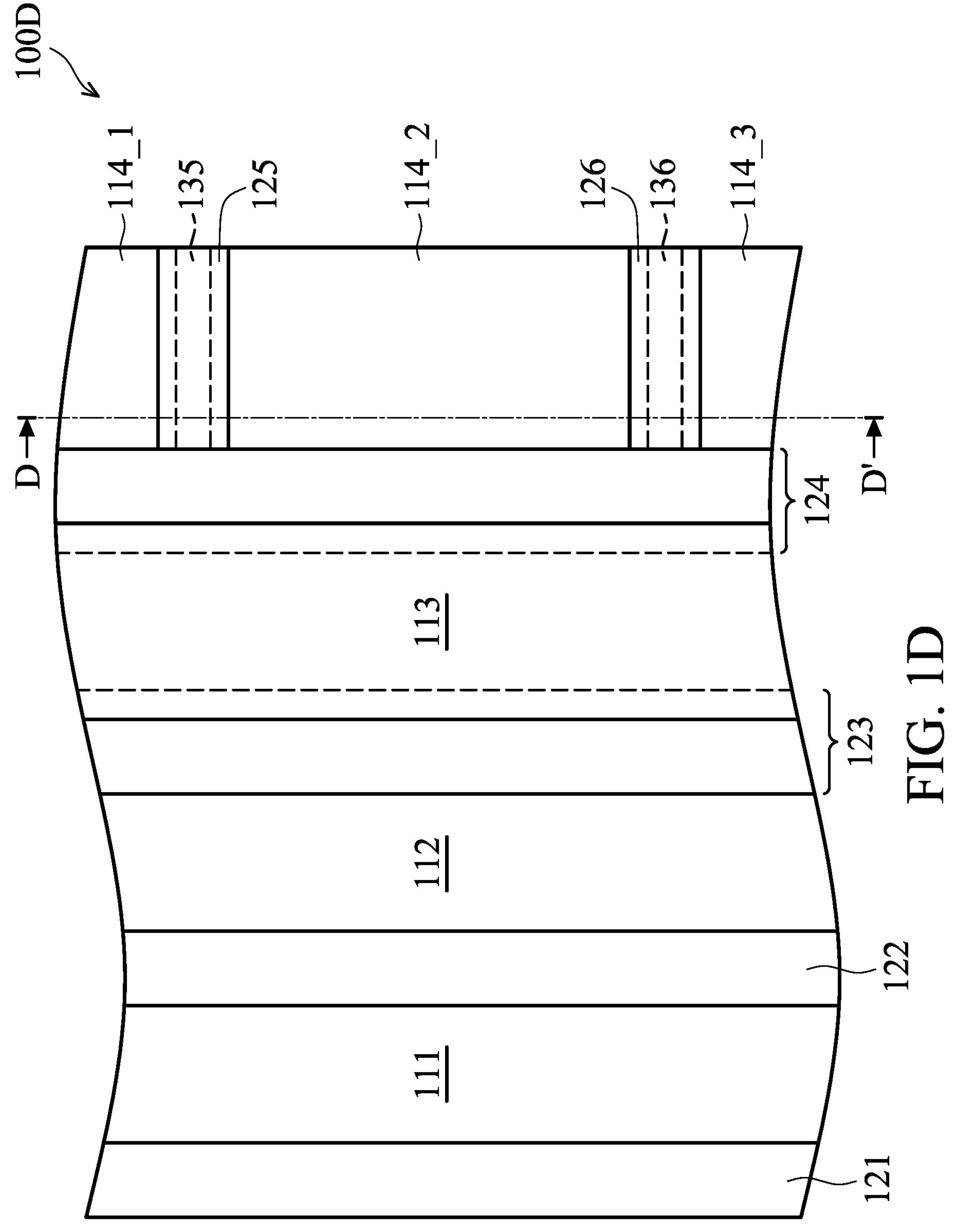
FIG. 1D is a plan view of another exemplary embodiment of an ESD protection device according to various aspects of the present disclosure.

FIG. 1D is a plan view of another exemplary embodiment of an ESD protection device according to various aspects of the present disclosure. FIG. 1D is similar to FIG. 1C witch the exception that the ESD protection device 100D further comprises isolation structures 125 and 126. The isolation structure 125 insulates the doped region 114_1 from the doped region 114_2 and covers the well region 135. The isolation structure 126 insulates the doped region 114_2 from the doped region 114_3 and covers the well region 136. In this embodiment, the well region 135 does not contact the doped regions 114_1 and 114_2, and the well region 136 does not contact the doped regions 114_2 and 114_3.

Figure 2:
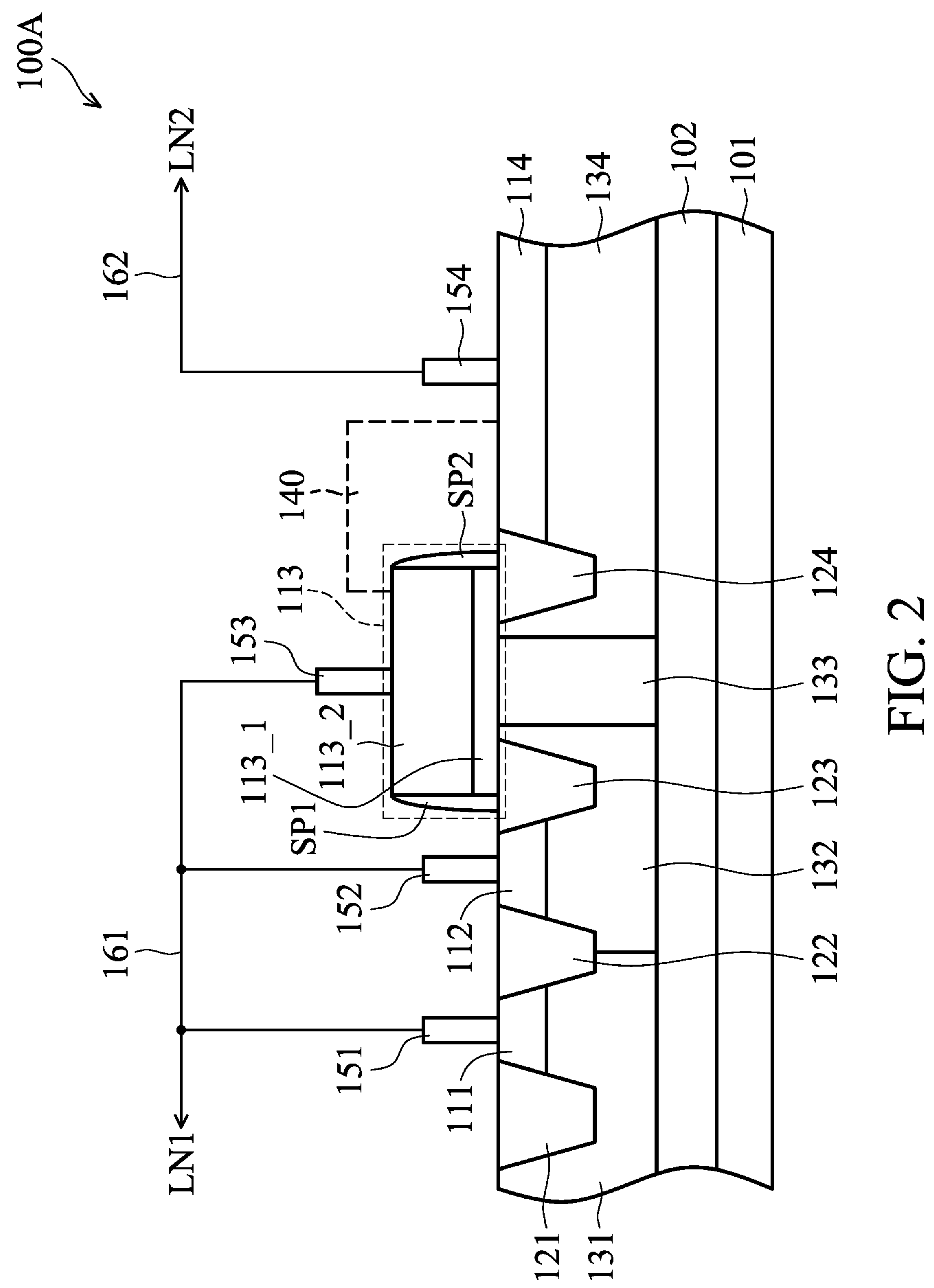
FIG. 2 illustrates a cross-sectional view of the ESD protection device shown in FIG. 1A, wherein the cross-sectional view is obtained from the plane containing X-X' in FIG. 1A.

FIG. 2 illustrates a cross-sectional view of the ESD protection device shown in FIG. 1A, wherein the cross-sectional view is obtained from the plane containing X-X' in FIG. 1A. A deep-well region 102 is formed on a substrate 101. In this embodiment, the substrate 101 has a first conductivity type, and the deep-well region 102 has a second conductivity type. The first conductivity type is opposite to the second conductivity type. For example, when the first conductivity type is a P-type, the second conductivity type is a N-type. When the first conductivity type is a N-type, the second conductivity type is a P-type.

The well region 131 is formed on the deep-well region 102 and has the second conductivity type. In one embodiment, the well region 131 is a high voltage well region. The doped region 111 is formed in the well region 131 and has the second conductivity type. In one embodiment, the impurity concentration of the doped region 111 is higher than the impurity concentration of the well region 131.

The well region 132 is formed on the deep-well region 102 and has the first conductivity type. In one embodiment, the well region 132 is a high voltage well region. The doped region 112 is formed in the well region 132 and has the first conductivity type. In one embodiment, the impurity concentration of the doped region 112 is higher than the impurity concentration of the well region 132.

The well region 133 is formed on the deep-well region 102 and has the second conductivity type. In one embodiment, the well region 133 is a high voltage well region. The impurity concentration of the well region 133 is similar to the impurity concentration of the well region 131. The gate structure 113 is disposed on the substrate 101 and completely covers the well region 133.

In some embodiments, the gate structure 113 comprises a gate dielectric layer 113_1 and a gate electrode layer 113_2. The gate electrode layer 113_2 may comprise silicon or polysilicon. In some embodiments, the gate structure 113 further comprises spacers SP1 and SP2. The spacer SP1 is disposed in the left-sides of the gate dielectric layer 113_1 and the gate electrode layer 113_2. The spacer SP2 is disposed in the right-sides of the gate dielectric layer 113_1 and the gate electrode layer 113_2.

The well region 134 is formed on the deep-well region 102 and has the first conductivity type. In one embodiment, the well region 134 is a high voltage well region. The doped region 114 is formed in the well region 134 and has the first conductivity type. In one embodiment, the impurity concentration of the doped region 114 is higher than the impurity concentration of the well region 134. In other embodiments, the impurity concentration of the doped region 114 is similar to the impurity concentration of the doped region 112. In this case, the impurity concentration of the well region 134 is similar to the impurity concentration of the well region 132.

In some embodiments, the ESD protection device 100A further comprises isolation structures 121~124. The doped region 111 is disposed between the isolation structures 121 and 122. The isolation structure 122 insulates the doped region 111 from the doped region 112. The isolation structure 123 insulates the doped region 112 from the well region 133. The isolation structure 124 insulates the well region 133 from the doped region 114. The gate structure 113 covers a portion of the isolation structure 123 and a portion of the isolation structure 124.

In other embodiments, the ESD protection device 100A further comprises the contact structures 151~154. The contact structure 151 is electrically connected to the doped region 111. The contact structure 152 is electrically connected to the doped region 112. The contact structure 153 is electrically connected to the gate structure 113. The contact structure 154 is electrically connected to the doped region 114. In some embodiments, when the first conductivity type is a P-type and the second conductivity type is a N-type, the ESD protection device 100A is serves as a PMOS transistor. In this case, the doped region 111 is provided as a bulk doped region and the contact structure 151 is served as the bulk of the PMOS transistor. Furthermore, the doped region 112 is provided as a source doped region, and the contact structure 152 is provided as a source of the PMOS transistor. The contact structure 153 is provided as a gate of the PMOS transistor. The doped region 114 is provided as a drain doped region and the contact structure 154 is served as a drain of the PMOS transistor.

Assuming the first conductivity type is a N-type and the second conductivity type is a P-type, the ESD protection device 100A serves as a NMOS transistor. The doped region 111 is provided as a bulk doped region and the contact structure 151 is served as the bulk of the NMOS transistor. Furthermore, the doped region 112 is provided as a source doped region, and the contact structure 152 is provided as a source of the NMOS transistor. The contact structure 153 is provided as a gate of the NMOS transistor. The doped region 114 is provided as a drain doped region and the contact structure 154 is served as a drain of the NMOS transistor.

In one embodiment, the ESD protection device 100A further comprises interconnect structures 161 and 162. The interconnect structure 161 is electrically connected to the contact structures 151~153 and coupled to a conductive wire LN1. The interconnect structure 162 is electrically connected to the contact structure 154 and coupled to a conductive wire LN2. When an ESD event occurs in the conductive wire LN1 and the conductive wire LN2 is coupled to the ground, an ESD current passes from the conductive wire LN1, through the doped region 112, the well regions 132, 133, and 134, the doped region 114, the conductive wire LN2, and into the ground.

In some embodiments, the ESD protection device 100A further comprises a resist protective oxide 140. The resist protective oxide 140 covers a portion of the gate structure 113, a portion of the isolation structure 124, and a portion of the doped region 114. In this embodiment, the resist protective oxide 140 prevents the surface resistance of the doped region 114 from being too low.

Figure 3:
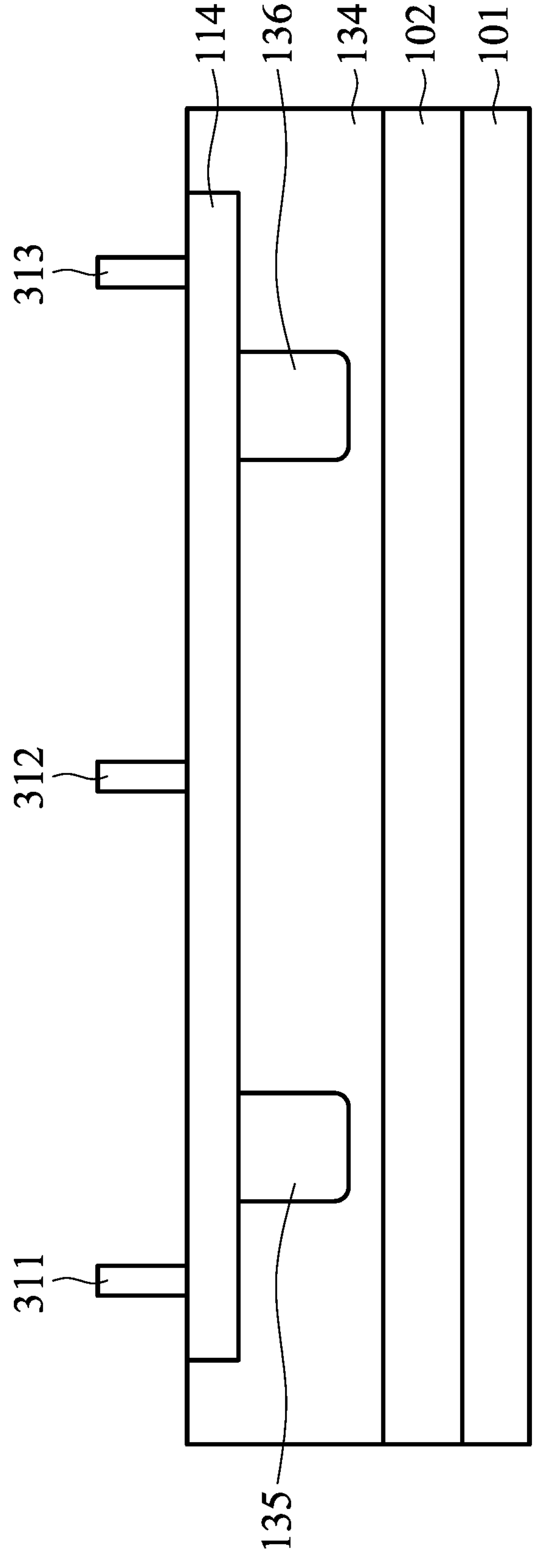
FIG. 3 illustrates a cross-sectional view of the ESD protection device shown in FIG. 1A, wherein the cross-sectional view is obtained from the plane containing Y-Y' in FIG. 1A.

FIG. 3 illustrates a cross-sectional view of the ESD protection device shown in FIG. 1A, wherein the cross-sectional view is obtained from the plane containing Y-Y' in FIG. 1A. As shown in FIG. 3, the well regions 135 and 136 are formed in the well region 134. Each of the well regions 135 and 136 has the second conductivity type. In this embodiment, the doped region 114 completely covers the well regions 135 and 136.

In some embodiments, the ESD protection device 100A further comprises the contact structures 311~313. The contact structures 311~313 are electrically connected to the doped region 114. In one embodiment, the contact structures are electrically connected to the ground. The number of the contact structures is not limited in the present disclosure. In other embodiments, the doped region 114 may be electrically connected to more or fewer contact structures. In some embodiments, the contact structures 311~313 are electrically connected to the contact structure 154 of FIG. 2.

Figure 4:
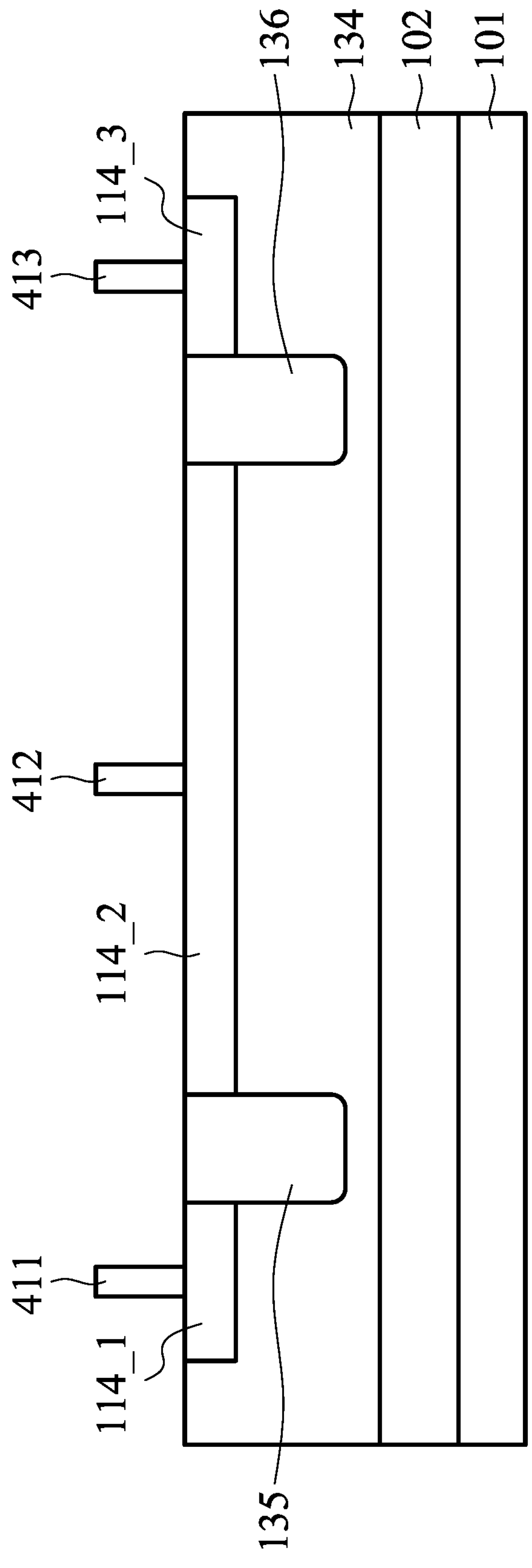
FIG. 4 illustrates a cross-sectional view of the ESD protection device shown in FIG. 1C, wherein the cross-sectional view is obtained from the plane containing C-C' in FIG. 1C.

FIG. 4 illustrates a cross-sectional view of the ESD protection device shown in FIG. 1C, wherein the cross-sectional view is obtained from the plane containing C-C' in FIG. 1C. As shown in FIG. 4, the well regions 135 and 136 are exposed from the surface of the doped region 114. In this embodiment, the well regions 135 and 136 divide the doped region 114 into the doped regions 114_1~114_3. The well region 135 insulates the doped region 114_1 from the doped region 114_2. The well region 136 insulates the doped region 114_2 from the doped region 114_3. In one embodiment, the impurity concentration of the well region 135 is similar to the impurity concentration of the well region 136, and higher than the impurity concentration of each of the well regions 131 and 133. Since the impurity concentrations of the well regions 131 and 133 are low, the well regions 131 and 133 are capable of accepting high voltage. Therefore, the well regions 131 and 133 are referred to as higher voltage well regions.

Each of the doped regions 114_1~114_3 has the first conductivity type. The impurity concentrations of the doped regions 114_1~114_3 are the same. The sizes of the doped regions 114_1~114_3 are not limited in the present disclosure. In one embodiment, the size of the doped region 114_2 is greater than the size of the doped region 114_1 and the size of the doped region 114_3. In another embodiment, the doped region 114_1 is similar in size to the doped region 114_3.

In some embodiments, the ESD protection device 100C further comprises contact structures 411~413. The contact structure 411 contacts the doped region 114_1. The contact structure 412 contacts the doped region 114_2. The contact structure 413 contacts the doped region 114_3. In one embodiment, the contact structures 411~413 are electrically connected to the ground. In some embodiments, the contact structure 411~413 are electrically connected to the contact structure 154 of FIG. 2.

When an ESD event occurs, since the well regions 135 and 136 divide the doped region 114, an ESD current is dispersed to the doped regions 114_1~114_3. Since the ESD currents in the doped regions 114_1~114_3 are low, the current tolerances of doped regions 114_1~114_3 are improved.

Figure 5:
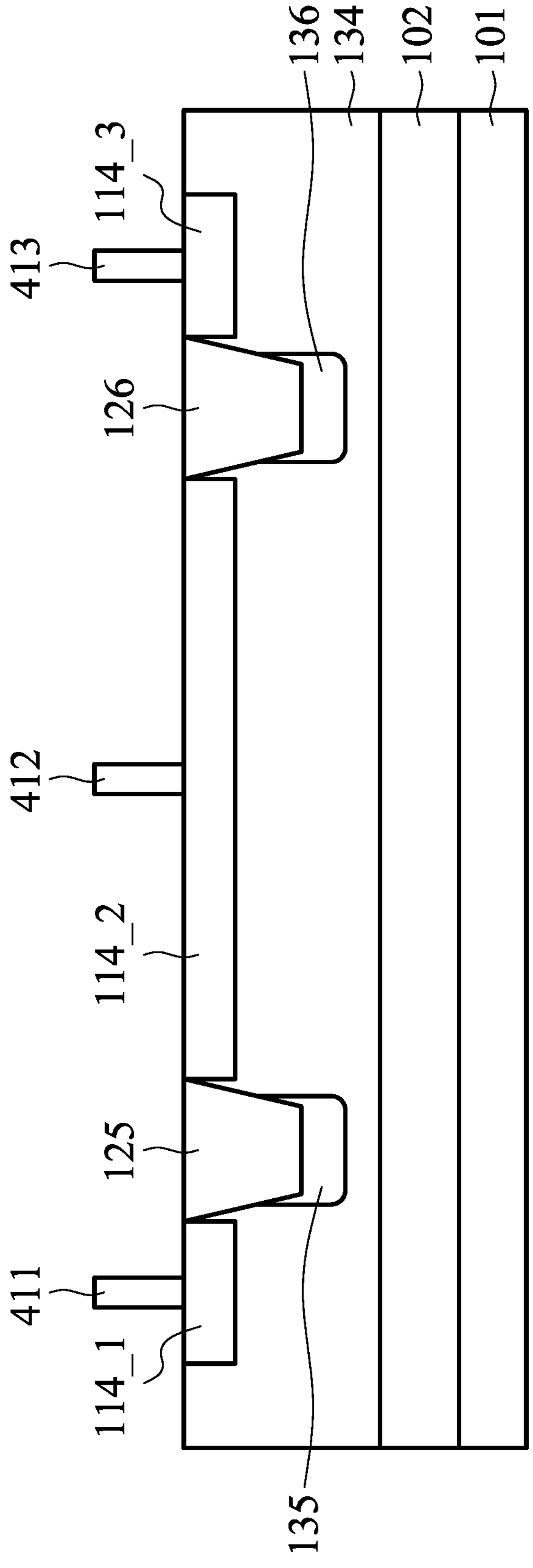
FIG. 5 illustrates a cross-sectional view of the ESD protection device shown in FIG. 1D, wherein the cross-sectional view is obtained from the plane containing D-D' in FIG. 1D.

FIG. 5 illustrates a cross-sectional view of the ESD protection device shown in FIG. 1D, wherein the cross-sectional view is obtained from the plane containing D-D' in FIG. 1D. FIG. 5 is similar to FIG. 4 with the exception that the well regions 135 and 136 are suspended in the well region 134. In this embodiment, the isolation structure 125 covers the well region 135. The isolation structure 126 covers the well region 136. In one embodiment, the isolation structure 125 isolates the doped regions 114_1 and 114_2, and the well region 135. Therefore, the well region 135 does not contact the doped regions 114_1 and 114_2. Additionally, the isolation structure 126 isolates the doped regions 114_2 and 114_3, and the well region 136. In this case, the well region 136 does not contact to the doped regions 114_2 and 114_3.

When an ESD event occurs, there is a large voltage difference between the well region s 134 and 135. Therefore, a vertical electric field is formed to cause a full depletion effect. The holes in the well region below the doped region 114_1 cannot enter the well region below the doped region 114_2. Similarly, the holes in the well region below the doped region 114_2 cannot enter the well region below the doped region 114_1 or the well region below the doped region 114_3. Therefore, the ESD current does not centralize in anyone of the doped regions 114_1~114_3.

It will be understood that when an element or layer is referred to as being "connected to" or "coupled to" another element or layer, it can be connected or coupled to the other element or layer or intervening elements or layers may be present. In contrast, when an element or layer is referred to as be "directly connected to" or "directly coupled to" another element or layer, there are no intervening elements or layers present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection device comprising:

a substrate having a first conductivity type;

a deep-well region formed on the substrate and having a second conductivity type;

a first well region formed on the deep-well region and having the second conductivity type;

a second well region formed on the deep-well region and having the first conductivity type;

a third well region formed on the deep-well region and having the second conductivity type;

a fourth well region formed on the deep-well region and having the first conductivity type;

a fifth well region formed in the fourth well region and having the second conductivity type;

a first doped region formed in the first well region and having the second conductivity type;

a second doped region formed in the second well region and having the first conductivity type;

a third doped region formed in the fourth well region and having the first conductivity type; and a gate structure covering the third well region, wherein an impurity concentration of the fifth well region is higher than an impurity concentration of the first well region and an impurity concentration of the third well region.

2. The ESD protection device as claimed in claim 1, further comprising:

a sixth well region formed in the fourth well region and having the second conductivity type.

3. The ESD protection device as claimed in claim 2, wherein the third doped region covers the fifth well region and the sixth well region.

4. The ESD protection device as claimed in claim 2, further comprising:

a fourth doped region formed in the fourth well region and having the first conductivity type, wherein the fifth well region is disposed between the third doped region and the fourth doped region.

5. The ESD protection device as claimed in claim 4, wherein the fourth doped region is disposed between the fifth well region and the sixth well region.

6. The ESD protection device as claimed in claim 4, further comprising:

a first isolation structure formed in the fourth well region and disposed between the third doped region and the fourth doped region, wherein the first isolation structure covers the fifth well region.

7. The ESD protection device as claimed in claim 6, wherein the first isolation structure insulates the third doped region, the fourth doped region and the fifth well region.

8. The ESD protection device as claimed in claim 7, further comprising:

a fifth doped region formed in the fourth well region and having the first conductivity type, wherein the sixth well region is disposed between the fourth doped region and the fifth doped region.

9. The ESD protection device as claimed in claim 8, further comprising:

a second isolation structure formed in the fourth well region and disposed between the fourth doped region and the fifth doped region, wherein the second isolation structure covers the sixth well region.

10. The ESD protection device as claimed in claim 9, wherein the second isolation structure insulates the fourth doped region, the fifth doped region, and the sixth well region.

11. The ESD protection device as claimed in claim 4, further comprising:

a first contact structure formed on the first doped region and contacting the first doped region;

a second contact structure formed on the second doped region and contacting the second doped region;

a third contact structure formed on the gate structure and contacting the gate structure;

a fourth contact structure formed on the third doped region and contacting the third doped region;

a fifth contact structure formed on the fourth doped region and contacting the fourth doped region.

12. The ESD protection device as claimed in claim 11, further comprising:

a first interconnect structure electrically connected to the first contact structure, the second contact structure, and the third contact structure; and a second interconnect structure electrically connected to the fourth contact structure and the fifth contact structure.

13. The ESD protection device as claimed in claim 1, further comprising:

a resist protective oxide covering a portion of the gate structure and a portion of the third doped region.

14. A transistor structure comprising:

a bulk doped region formed in a first well region;

a source doped region formed in a second well region;

a gate structure covering a third well region;

a first drain doped region formed in a fourth well region;

a fifth well region formed in the fourth well region; and a sixth well region formed in the fourth well region, wherein:

the bulk doped region, the first well region, the third well region, the fifth well region, and the sixth well region have the same conductivity type, the source doped region, the second well region, the first drain doped region, and the fourth well region have the same conductivity type, an impurity concentration of each of the fifth and sixth well regions is higher than an impurity concentration of each of the first and third well regions.

15. The transistor structure as claimed in claim 14, further comprising:

a second drain doped region formed in the fourth well region; and a third drain doped region formed in the fourth well region, wherein:

the fifth well region is disposed between the first drain doped region and the second drain doped region, the sixth well region is disposed between the second drain doped region and the third doped region.

16. The transistor structure as claimed in claim 15, wherein the fifth well region insulates the first drain doped region from the second drain doped region, and the sixth well region insulates the second drain doped region from the third drain doped region.

17. The transistor structure as claimed in claim 15, wherein a size of the second drain doped region is greater than a size of the first drain doped region and a size of the third drain doped region.

18. The transistor structure as claimed in claim 15, further comprising:

a first isolation structure covering the fifth well region; and a second isolation structure covering the sixth well region, wherein:

the first isolation structure insulates the first drain doped region, the second drain doped region, and the fifth well region, the second isolation structure insulates the second drain doped region, the third drain doped region, and the sixth well region.

* * * * *